(12) United States Patent
Jang et al.

(10) Patent No.: US 8,048,595 B2
(45) Date of Patent: Nov. 1, 2011

(54) EXTREME ULTRAVIOLET PHOTOMASK AND METHODS AND APPARATUSES FOR MANUFACTURING THE EXTREME ULTRAVIOLET PHOTOMASK

(75) Inventors: Ilyong Jang, Yongin-si (KR); SangGyun Woo, Yongin-si (KR); Sungmin Huh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 61 days.

(21) Appl. No.: 12/654,174

(22) Filed: Dec. 11, 2009

(65) Prior Publication Data
US 2010/0167186 A1  Jul. 1, 2010

(30) Foreign Application Priority Data
Dec. 11, 2008  (KR) .................. 10-2008-0125971

(51) Int. Cl.
*G03F 1/00* (2006.01)
(52) U.S. Cl. ........................................... 430/5
(58) Field of Classification Search ............... 430/5, 30; 204/192.32, 192.34; 250/492.2, 492.21, 250/492.22, 492.23, 492.24; 378/35
See application file for complete search history.

(56) References Cited

U.S. PATENT DOCUMENTS

| 4,309,267 | A | 1/1982 | Boyd et al. |
| 7,700,444 | B2 * | 4/2010 | Chen .............................. 438/279 |
| 7,879,201 | B2 * | 2/2011 | Druz et al. ............... 204/192.11 |
| 2005/0266317 | A1 * | 12/2005 | Gallagher et al. ................ 430/5 |
| 2009/0246713 | A1 * | 10/2009 | Zin et al. ....................... 430/323 |

FOREIGN PATENT DOCUMENTS

| KR | 10-2000-0033006 A | 6/2000 |
| KR | 10-2007-0036519 A | 4/2007 |

OTHER PUBLICATIONS

Sugawara, Minoru, et al., "Effect of incident angle of off-axis illumination on pattern printability in extreme ultraviolet lithography", J. Vac. Sci. Technol. B21(6), pp. 2701-2705 (Nov./Dec. 2003).

* cited by examiner

Primary Examiner — Stephen Rosasco
(74) Attorney, Agent, or Firm — Lee & Morse, P.C.

(57) ABSTRACT

A method of manufacturing a photomask includes forming an upper layer on a photomask substrate, and patterning the upper layer to form an upper pattern having an inclined sidewall, wherein patterning the upper layer includes anisotropically etching the upper layer using charged particles moving in parallel to a first direction inclined toward a top surface of the upper layer.

17 Claims, 15 Drawing Sheets

EXTREME ULTRAVIOLET PHOTOMASK AND METHODS AND APPARATUSES FOR MANUFACTURING THE EXTREME ULTRAVIOLET PHOTOMASK

BACKGROUND

1. Field

Example embodiments relate to photomasks. More particularly, example embodiments relate to extreme ultraviolet photomasks and methods and apparatuses for manufacturing the ultraviolet photomasks.

2. Description of the Related Art

Sizes of patterns formed on a semiconductor substrate may be reduced to satisfy a superior performance and a low price that users require. A wavelength of a light source used in a conventional lithography process may be reduced to meet such requirements. For example, a light of g-line (436 nm) band and of i-line (365 nm) band may be replaced with a light source of deep ultraviolet band or extreme ultraviolet band.

Since light of extreme ultraviolet band may be absorbed in a refractive optical material, extreme ultraviolet lithography may generally use a reflective optical system. Therefore, a path of a light incident on and reflected from a conventional extreme ultraviolet photomask may be non-perpendicular with respect to a top surface of the conventional extreme ultraviolet photomask. For example, a path of light incident on or reflected from the conventional extreme ultraviolet photomask light may be inclined at about 6 degrees with respect to a normal to the top surface of the photomask.

However, due to the inclined light path, a shadow may be formed due to a shading pattern (i.e., an absorbing pattern) on the photomask, i.e., a shadowing effect, thereby affecting progress of the light. The shadowing effect may cause deformation of a pattern being transferred to a wafer, e.g., degradation of a contrast characteristic and distortion of a critical dimension (CD) of the wafer pattern, and a problem of H-V bias.

SUMMARY

Embodiments are therefore directed to an extreme ultraviolet photomask, a method of forming the same, and an apparatus for manufacturing the same, which substantially overcome one or more of the problems due to the limitations and disadvantages of the related art.

It is therefore a feature of an embodiment to provide a method of forming a photomask by preventing or substantially minimizing a shadowing effect.

It is another feature of an embodiment to provide a photomask with extreme ultraviolet light absorbing layer having inclined sidewalls in order to prevent or substantially minimize a shadowing effect.

It is yet another feature of an embodiment to provide a plasma etching chamber system with a position controller configured to control position and direction of a photomask substrate, thereby facilitating formation of an extreme ultraviolet absorbing layer having inclined sidewalls.

At least one of the above and other features and advantages may be realized by providing a method for manufacturing a photomask, including after forming an upper layer on a photomask substrate, patterning the upper layer to form an upper pattern having an inclined sidewall. Patterning the upper layer may include anisotropically etching the upper layer using charged particles moving in parallel to a first direction inclined toward a top surface of the upper layer.

Anisotropically etching the upper layer may include maintaining the photomask substrate fixed during the etching. Anisotropically etching the upper layer may include forming the upper pattern to have a cross section of a parallelogram. Anisotropically etching the upper layer may include rotating the photomask substrate around a rotating axis parallel to a normal to a top surface of the photomask during the etching. Rotating the photomask substrate may include setting the photomask substrate at discrete angles around the rotating axis during the etching. Rotating the photomask substrate may include continuously rotating the photomask substrate around the rotating axis during the etching. Anisotropically etching the upper layer may include forming the upper pattern to have a cross section of an inverted trapezoid. The upper layer may be formed of a material configured to absorb an extreme ultraviolet light. The method may further include forming a buffer layer between the upper layer and the multilayer, the buffer layer including at least one material having an etching selectivity with respect to the upper layer.

The method may further include, after forming the upper pattern, forming an absorbing pattern on the photomask substrate using the upper pattern as a molder, and removing the upper pattern to expose a sidewall of the absorbing pattern. Forming the absorbing pattern may include forming an absorbing layer on the photomask substrate to surround the upper pattern, such that a space around the upper pattern is filled, and etching back the absorbing layer to expose a top surface of the upper pattern. Anisotropically etching the upper layer may include arranging the photomask substrate with the upper layer thereon in a plasma etching chamber, such that the plasma etching chamber generates the charged particles to be directed at an oblique angle with respect to a top surface of the upper layer. Anisotropically etching the upper layer may further include controlling a moving direction of the charged particles in the plasma etching chamber via a Faraday cage, and controlling an angle between the photomask substrate and the first direction via a position controller. Anisotropically etching the upper layer may further include controlling a rotation of the photomask on a rotating axis thereof via a rotation controller in the position controller.

At least one of the above and other features and advantages may also be realized by providing a photomask, including a photomask substrate, an absorbing pattern disposed on the photomask substrate, and a multilayer disposed between the absorbing pattern and the photomask substrate. A top surface and one sidewall of the absorbing pattern may define an acute angle. The absorbing pattern may have a cross section of a parallelogram in a plane substantially perpendicular to a top surface of the photomask substrate. The photomask may further include a buffer layer disposed between the absorbing pattern and a multilayer. The buffer layer may overlap the entire multilayer, a thickness of the buffer layer being greater under the absorbing pattern than in a region around the absorbing pattern. The buffer layer includes a material having an etching selectivity with respect to the absorbing pattern.

At least one of the above and other features and advantages may also be realized by providing a photomask, including a photomask substrate, an absorbing pattern disposed on the photomask substrate, and a multilayer disposed between the absorbing pattern and the photomask substrate. The absorbing pattern may have at least one sidewall to define an obtuse angle with a top surface of the absorbing pattern. At least two sidewalls of the absorbing pattern may define an obtuse angle with the top surface of the absorbing pattern. At least one corner of the absorbing pattern may have a rounded sidewall. At least a pair of sidewalls of the absorbing pattern may have a depression portion in a corner region therebetween, the depression portion having a right triangular pyramid shape, and the pair of sidewalls of the absorbing pattern being substantially perpendicular to each other. The photomask may further include a buffer layer disposed between the absorbing pattern and a multilayer. A thickness of the buffer layer may be smaller at a center of the absorbing pattern than at an edge of the absorbing pattern.

At least one of the above and other features and advantages may also be realized by providing a plasma etching chamber system, including a chuck configured to support a substrate, a plasma generation portion configured to ionize an etching gas, and a position controller configured to control a position of the chuck, wherein the position controller includes an inclined angle controller configured to control an angle of a top surface of the chuck with respect to a moving direction of the ionized etching gas. The plasma etching chamber system may further include an ion direction controller configured to control a moving direction of the ionized etching gas. The ion direction controller may include a Faraday cage. The position controller may further include a rotation controller configured to control a rotation of the photomask substrate on a rotation axis parallel to a top surface of the photomask substrate, the rotation controller being configured to rotate the chuck while an etching process is performed. The inclined angle controller may be configured to control variably an angle of the top surface of the chuck in a range of about (−60) degrees to about 60 degrees.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
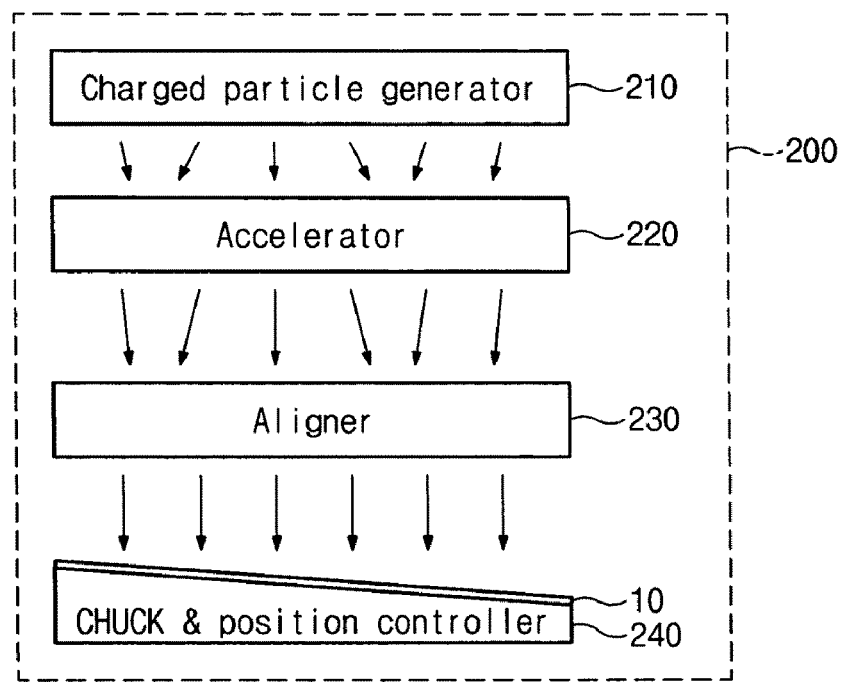
FIGS. 1 and 2 illustrate schematic representations of a plasma etching chamber in accordance with an embodiment.

Korean Patent Application No. 10-2008-0125971, filed on Dec. 11, 2008, in the Korean Intellectual Property Office, and entitled: "Extreme Ultraviolet Photomask and Methods and Apparatuses for Manufacturing the Extreme Ultraviolet Photomask," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

Hereinafter, methods of forming upper patterns having inclined sidewalls by performing a taper etching on an upper layer on a photomask substrate (hereinafter it is referred to as substrate) will be described. The etching process may be performed in a plasma etching chamber and the methods of taper etching may be variously classified according to a relative position and a relative direction between the substrate and the plasma etching chamber. Here, to distinctly describe the methods of the taper etching, the plasma etching chamber in accordance with embodiments is described first, and then a relative position and a relative direction between the substrate and the plasma etching chamber is defined.

Figure 2:
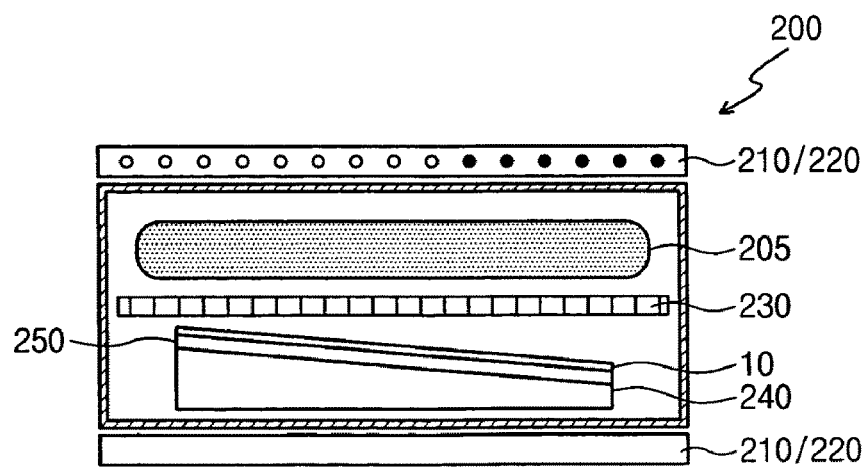

FIGS. 1 and 2 illustrate a plasma etching chamber in accordance with an embodiment. Referring to FIGS. 1 and 2, a plasma etching chamber 200 may include a chuck 250 on which a substrate 10 is loaded, a plasma generator 210, an accelerator 220, an aligner 230, i.e., an ion direction controller, and a position controller 240 to control a position and a direction of the chuck.

The plasma generator 210 and the accelerator 220 may include radio frequency power supplies and electrodes coupling to the radio frequency power supplies, respectively. The plasma generator 210 and the accelerator 220 may be configured to change a process gas supplied to the plasma etching chamber 200 into a plasma state 205 and to increase kinetic energy of plasma ions. According to an embodiment, the plasma generator 210 and the accelerator 220 may have any suitable configuration, e.g., a substantially same configuration as conventional plasma etching chambers. The aligner 230, e.g., a Faraday cage including grid, may control direction of the ions in the plasma state 205, so the ions may be incident on the position controller 240 at a predetermined angle, e.g., as indicated by the arrows in FIG. 1.

The position controller 240 may be configured to control a position and a direction of the chuck 250, i.e., the chuck 250 may support a substrate 10 and may be at a substantially same position and angle as the substrate 10. More specifically, a predetermined position of the plasma etching chamber 200 may be selected as a reference point (O) to define a position of the chuck 250. In this case, the position of the chuck may be described by three Cartesian coordinates (i.e., x, y, z) expressing a distance between a specific position (P) of the chuck and the reference point (O) in a Cartesian coordinate system defined by three axis (e.g., x axis, y axis and z axis) perpendicular to one another.

In addition, since the chuck 250 may be considered as a rigid body having a limited volume and an unchangeable shape, the chuck 250 may rotate toward respective independent three directions. For example, a top surface of the chuck 250 may rotate along a normal to the top surface of chuck 250, and a first angle (θ) will be used to express an extent of this rotation. Also, the top surface of chuck 250 may rotate along an axis (e.g., x axis or y axis) parallel to the top surface of chuck 250, and a second angle (Φ) will be used to express an extent of this rotation. The position controller 240 may be configured to control the position coordinates (x, y, z) and the rotational angles (θ, Φ), as will be discussed in more detail below with reference to FIGS. 3 and 4A-4B.

Figure 3:
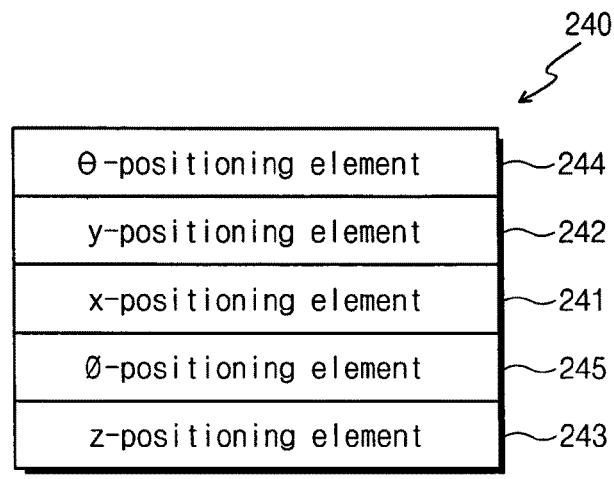
FIG. 3 illustrates a schematic representation of a position controller of a plasma etching chamber in accordance with an embodiment.

As illustrated in FIG. 3, the position controller 240 may include x-, y- and z-coordinate controllers 241, 242 and 243 to control the position coordinates (x, y, z) of the chuck 250, respectively, and θ- and Φ-angle controllers 244 and 245 to control the rotational angles (θ, Φ) of the chuck 250, respectively. An arrangement of the coordinate controllers and the angle controllers may be variously changed.

Figure 4A:
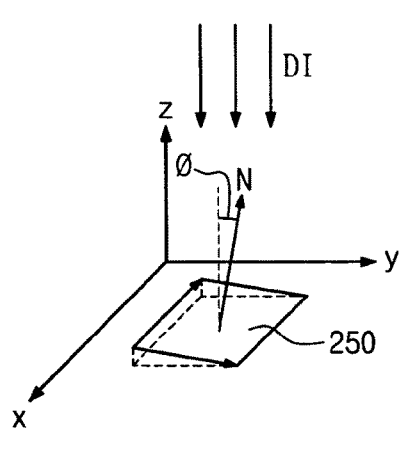
FIGS. 4A and 4B illustrate methods for a taper etching in accordance with embodiments.
Figure 4B:
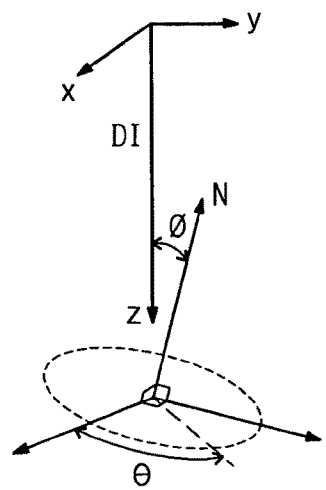

According to an embodiment, the Φ-angle controller 245, i.e., an inclined angle controller, may be configured to variably control the second angle (Φ) in a range of about 0 degrees to about 60 degrees. In this case, as illustrated in FIG. 4A, the second angle (Φ) determines an angle between the normal (N) to the top surface of the chuck 250 and a proceeding direction (DI) of the ions. Therefore, a pattern disposed on the substrate 10 or other layer positioned on the chuck 250, i.e., an upper pattern on the substrate 10, may be formed to have an inclined sidewall in accordance with the second angle (Φ). In addition, as illustrated in FIG. 4B, the θ-angle controller 244, i.e., a rotation controller, may be configured to, e.g., freely, rotate the chuck 250, i.e., the substrate 10, to adjust the first angle (θ) in a range of 0 degree to 360 degrees. Therefore, different surfaces of, e.g., the upper pattern on the substrate 10, may be contacted by the ions in accordance with adjustment of the first angle (θ).

According to embodiments of the method for taper etching, during the etching step, the second angle (Φ) may be fixed, e.g., an angle selected in the range of 0 degree to 60 degrees to determine the angle of the inclined sidewalls of the upper pattern, and the first angle (θ) may vary, e.g., an angle selected in the range of 0 degree to 360 degrees to etch different sidewalls of the upper pattern. For example, the first angle (θ) may continuously vary in a predetermined range, e.g., continuously vary between 0 degree to 90 degrees or between 0 degree to 360 degrees, or may vary between a plurality of discontinuous angles, e.g., vary discontinuously between 0 degree, 45 degrees, 90 degrees, 180 degrees, and 270 degrees.

When the first angle (θ) is fixed, one of sidewalls of the upper pattern may be formed to be inclined. However, when the first angle (θ) continuously or discontinuously varies, a plurality of sidewalls of the upper pattern may be formed to be inclined. A direction from which the inclined sidewall is formed may depend on how the first angle (θ) varies.

Manufacturing Method: A First Embodiment

Figure 5:
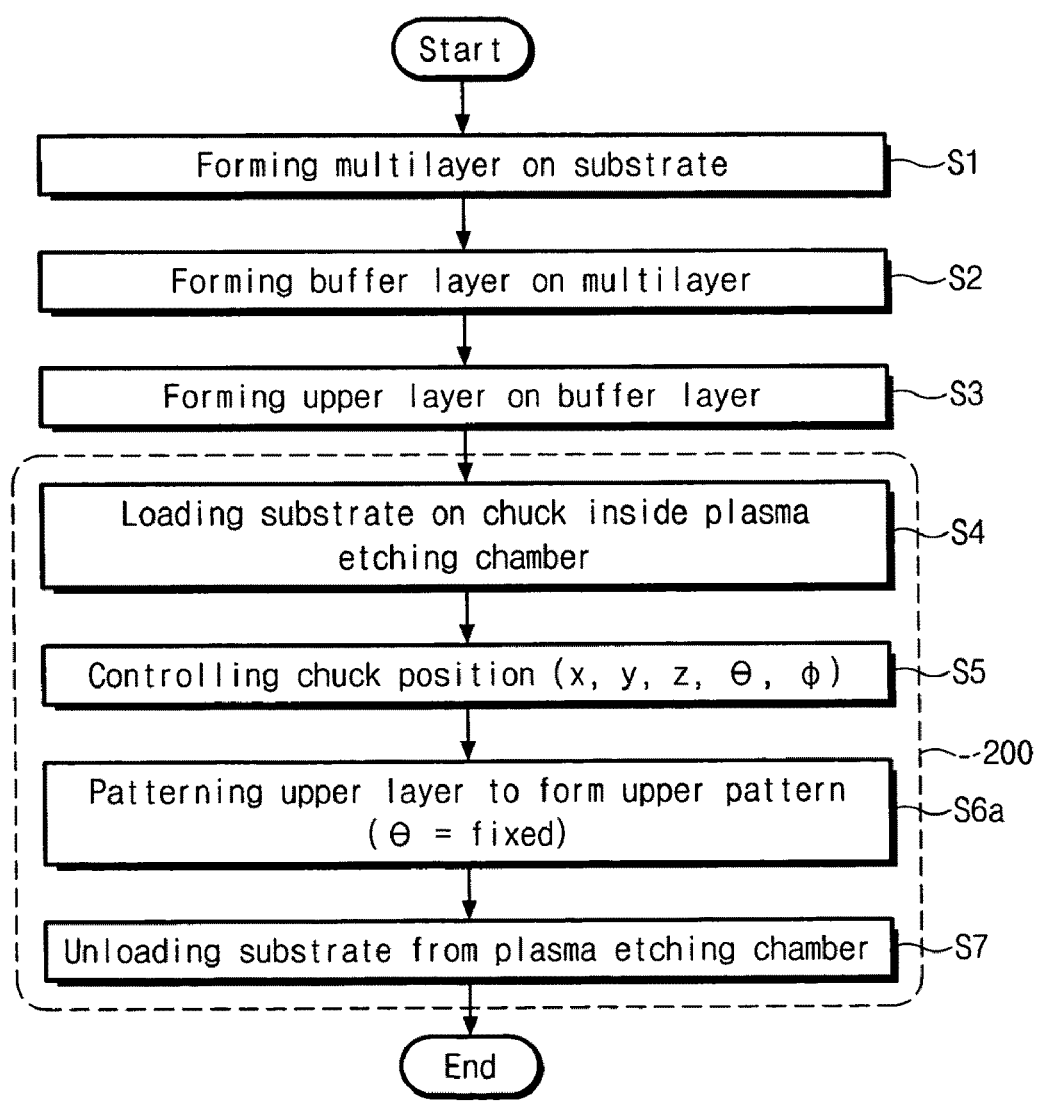
FIG. 5 illustrates a process flow chart of a method of manufacturing a photomask in accordance with a first embodiment.
Figure 6:
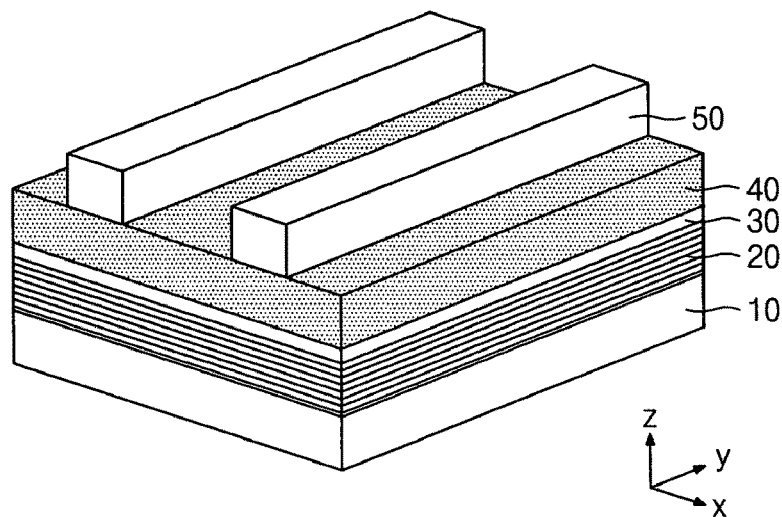
FIGS. 6 through 8 illustrate perspective views of stages in a method of manufacturing a photomask in accordance with a first embodiment.
Figure 7:
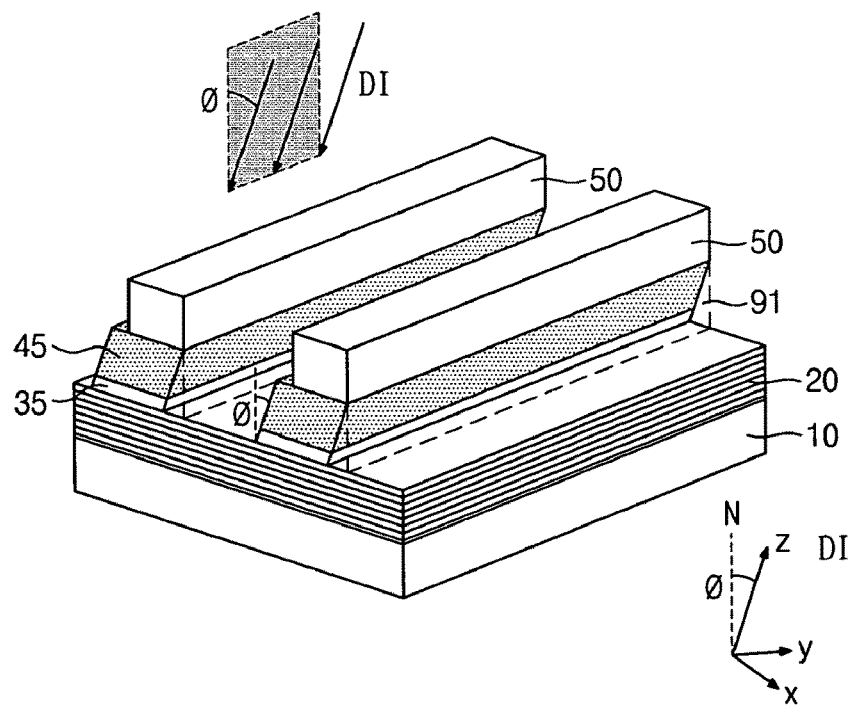
Figure 8:
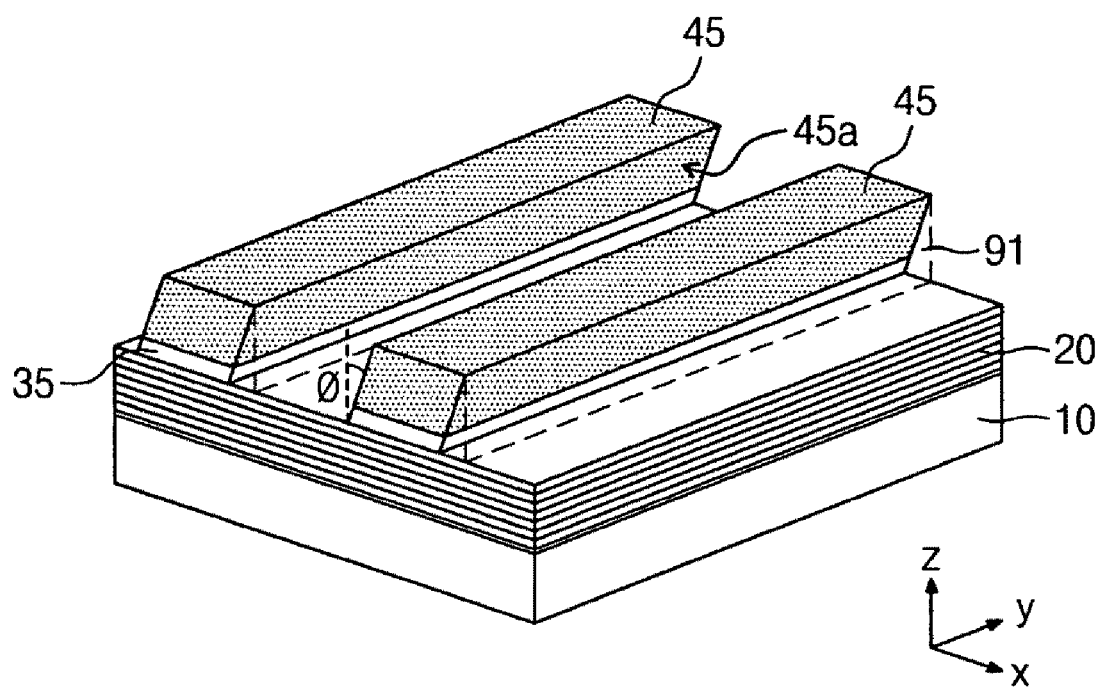

FIG. 5 illustrates a process flow chart of a method of manufacturing a photomask in accordance with a first embodiment. FIGS. 6 through 8 illustrate perspective views of stages in a method of manufacturing a photomask in accordance with the first embodiment.

Referring to FIGS. 5 and 6, in operation S1, a multilayer 20 may be formed on the substrate 10, i.e., a photomask substrate. The substrate 10 may be formed of any suitable material having a low thermal expansion characteristic, e.g., glass. The multilayer 20 may include a plurality of thin films constituting Bragg reflector to improve a reflectance of an extreme ultraviolet radiation used in an extreme ultraviolet exposure system. According to an embodiment, the multilayer 20 may include, e.g., a molybdenum layer and a silicon layer that are alternately stacked. A number of the thin films in the multilayer 20 may be about 40 to about 60. For example, the molybdenum layer may be formed to have a thickness of about 2.8 nm, and the silicon layer may be formed to have a thickness of about 4.0 nm or about 4.1 nm. It is noted, however, that the thicknesses of the thin films in the multilayer 20 may be selected to be different from the illustrated values in accordance with a wavelength of an extreme ultraviolet radiation used.

Next, in operations S2 and S3, a buffer layer 30 and an upper layer 40, respectively, may be sequentially formed on, e.g., directly on, the multilayer 20. The upper layer 40 may be formed of a material capable of absorbing an extreme ultraviolet radiation. For example, the upper layer 40 may be formed of a conductive absorber, e.g., a tantalum nitride layer (TaN). However, the material for the upper layer 40 is not limited to TaN and may variously vary. The buffer layer 30 may be used as an etch stop layer in a subsequent etching step to pattern the upper layer 40. For example, the buffer layer 30 may be a silicon nitride layer and/or a silicon oxide layer. According to a modified embodiment, the upper layer 40 may be directly formed on the multilayer 20 without the buffer layer 30.

Subsequently, as illustrated in FIG. 6, a mask pattern 50 to pattern the upper layer 40 may be formed on the upper layer 40. According to an embodiment, the mask pattern 50 may be a photoresist pattern.

Referring to FIGS. 5 and 7, the upper layer 40 may be patterned using the mask pattern 50 as an etching mask to form an upper pattern 45 to expose a portion of a top surface of the buffer layer 30. According to a modified embodiment, the buffer layer 30 may also be etched, e.g., during etching of the upper level 40 or in a separate subsequent etching process, as depicted in FIG. 7, to form a buffer pattern 35 exposing a top surface of the multilayer 20.

In detail, according to the first embodiment, the upper layer 40 may be patterned to form the upper pattern 45 with an inclined sidewall to define a first undercut region 91 through the taper etching method. The taper etching may be performed in the plasma etching chamber 200 described previously with reference to FIGS. 1 through 3.

In more detail, the structure of FIG. 6, i.e., the upper layer 40 with the mask pattern 50 on the substrate 10, may be loaded onto the chuck 250 in the plasma etching chamber 200 in operation S4. Subsequently, in operation S5, the position and directions (x, y, z, Φ, θ) of the chuck 250 may be controlled by operating the position controller 240. Next, in operation S6a, the upper layer 40 may be anisotropically etched with the plasma ions 205 using the mask pattern 50 as an etching mask to form the upper pattern 45. Once the upper pattern 45 is formed, the substrate 10 on which the upper pattern 45 is formed may be unloaded from the plasma etching chamber 200 (operation S7). After that, the mask pattern 50 may be selectively removed to expose a top surface of upper pattern 45. FIG. 8 illustrates a resultant structure of the upper pattern 45 after the mask pattern 50 is removed.

According to the first embodiment, operation S6a, i.e., forming the upper pattern 45, may be performed while the position and direction of the substrate 10 are relatively fixed with respect to the plasma etching chamber 200. That is, while the upper layer 40 is being etched, position coordinates (x, y, z) and rotational angles (θ, Φ) of the chuck 250 may not be changed from their initial values, e.g., values set and adjusted in operation S5.

For example, referring to FIGS. 7 and 8, the first angle (θ) may be selected to be disposed in a direction substantially perpendicular to a major axis of the mask pattern 50, e.g., the first angle (θ) may be along a direction parallel to the x-axis and the major axis of the mask pattern 50 may be along the y-axis. Therefore, sidewalls in the zy-plane of an initial pattern may be inclined during operation S6a to form the upper pattern 45 with inclined sidewalls 45a, i.e., sidewalls having a major axis along the y-axis. Only the sidewalls of the upper pattern 45 in the zy-plane may be etched, i.e., when the first angle is set along the x-axis, so only a pair of sidewalls of the upper pattern 45 facing each other may be formed to be selectively inclined. In other words, as illustrated in FIG. 8, a cross section of the upper pattern 45 in the xz-plane may have a shape of a parallelogram due to the inclined sidewalls of the upper pattern 45. As illustrated in FIG. 7, the incline of the sidewalls of the upper pattern may be determined by the second angle (Φ).

Manufacturing Method: A Second Embodiment

Figure 9:
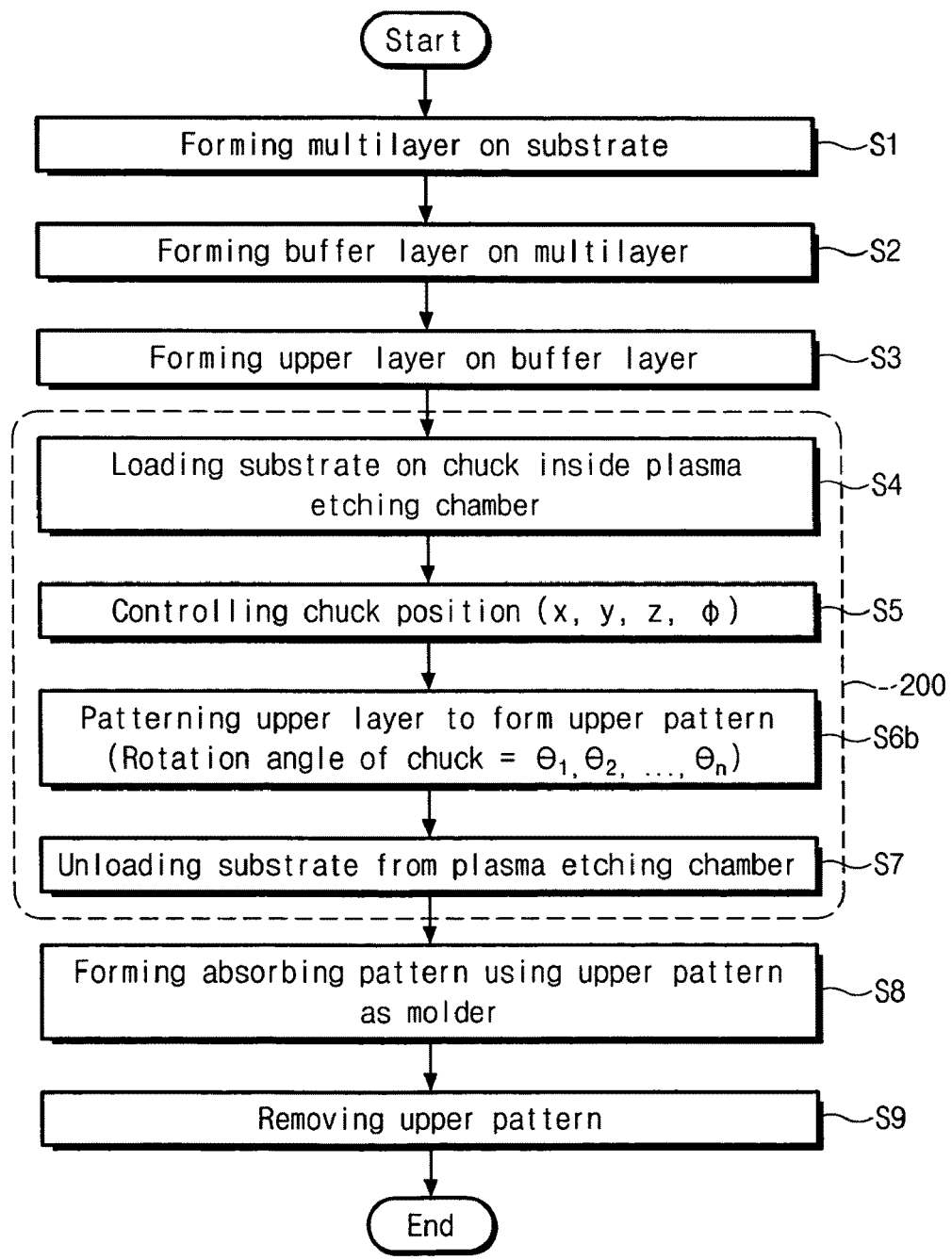
FIG. 9 illustrates a process flow chart of a method of manufacturing a photomask in accordance with a second embodiment.

FIG. 9 illustrates a process flow chart of a method of manufacturing a photomask in accordance with a second embodiment. FIGS. 10 through 14 illustrate perspective views of stages in a method of manufacturing a photomask in accordance with the second embodiment. The second embodiment may be substantially the same as the first embodiment described previously with reference to FIGS. 5-8, with the exception that (i) the upper pattern 45 may be used as a mold to form an absorbing pattern, as opposed to being used as an absorbing pattern, and (ii) the substrate 10 may be rotated during the etching process to form the upper pattern 45.

Figure 10:
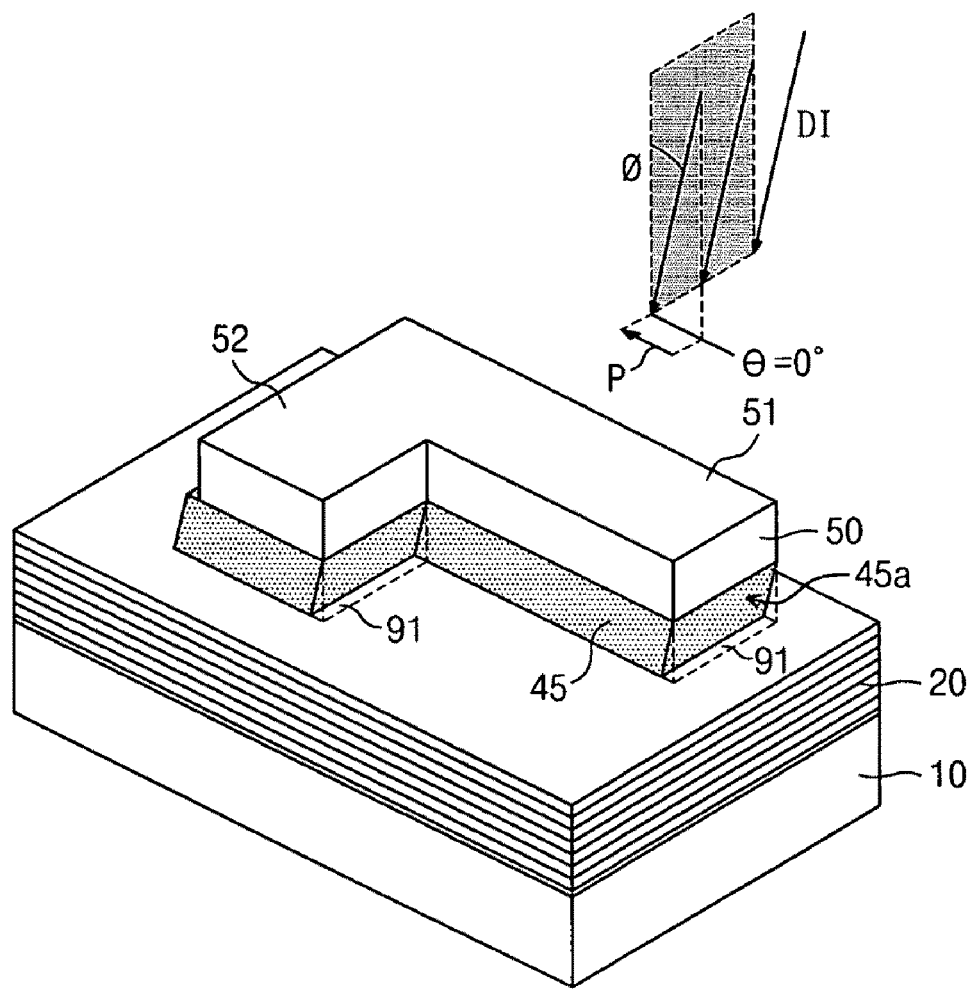
FIGS. 10 through 14 illustrate perspective views of stages in a method of manufacturing a photomask in accordance with a second embodiment.

In detail, referring to FIGS. 9 and 10, the multilayer 20 may be formed on the substrate 10 (operation S1), and the upper layer 40 may be formed on, e.g., directly on, the multilayer 20 (operation S3). After the mask pattern 50 to pattern the upper pattern 40 is formed on the upper layer 40, the upper layer 40 may be patterned using the mask pattern 50 as an etching mask to expose a portion of a top surface of the multilayer 20. Although not depicted, before forming the upper layer 40, the buffer layer 30 may or may not be formed on the multilayer 20.

According to the second embodiment, the upper pattern 45 may be used as a molder to form an absorbing pattern. The upper layer 40 may include at least one material suitable to be used as an absorbing pattern, e.g., a tantalum nitride layer, and at least one additional material. For example, in addition to tantalum nitride, the upper layer 40 may include at least one of a silicon oxide layer, a silicon nitride layer, a silicon oxynitride layer, a silicon layer, etc.

Patterning the upper layer 40 may include a taper etching performed in the plasma etching chamber 200. In detail, the taper etching may include the substrate 10 loading in operation S4, the chuck 250 controlling in operation S5, a patterning of the upper layer 40 in operation S6b, and the unloading in operation S7. Operations S4, S5, and S7 are substantially the same as those described previously with reference to FIG. 5.

According to the second embodiment, patterning the upper layer 40 in operation S6b may be performed at a fixed second angle (Φ) of the substrate 10, while the first angle (θ) may be varied among a plurality of discontinuous angles (e.g., 0 degree, 45 degrees, 90 degrees, 180 degrees and 270 degrees). For example, FIGS. 10 and 11 illustrate a resultant structure of a taper etching performed under the condition that the first angle (θ) is 0 degree and 90 degrees, and the second angle (Φ) is a predetermined angle which is not 0 degree.

In detail, referring to FIG. 10, the mask pattern 50 may include a portion 51 and a portion 52 which are respectively parallel to and perpendicular to a projection (P) of the ion direction (DI) onto a top surface of substrate 10. It is noted that portions 51 and 52 are illustrated for convenience of explanation and ease of understanding, and the mask pattern 50 may include the portions 51 and 52 in any geometrical configuration, only one of the portions 51 and 52, a plurality of either of portions 51 and 52, etc.

Referring to FIG. 10, as described previously with reference to FIGS. 5-8, the second angle (Φ) may be set at an angle other than 0 degree in order to form the upper pattern 45 with inclined sidewalls, i.e., define the first undercut region 91 under the mask pattern 50. In this case, since the taper etching is performed under the condition that the first angle (θ) is initially fixed at 0 degree, a pair of sidewalls 45a of the upper pattern 45 may be formed to be selectively inclined, e.g., a pair of sidewalls facing a same direction in FIG. 10.

Figure 11:
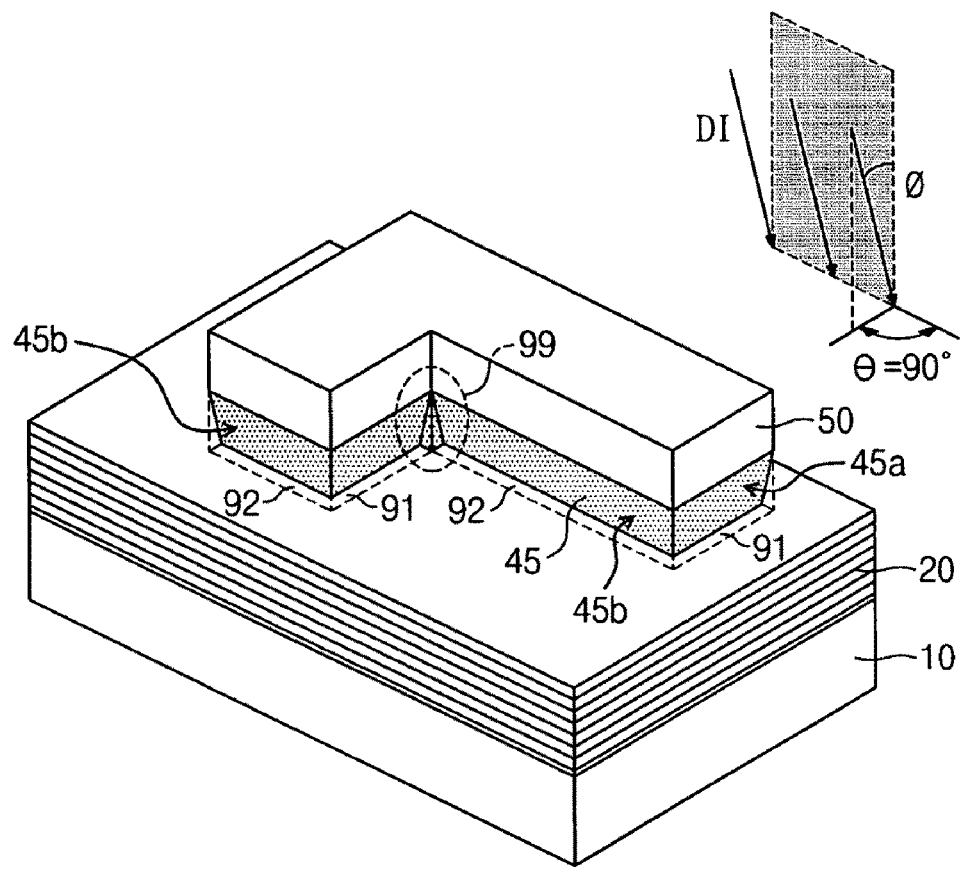

Referring to FIG. 11, the first angle (θ) may be varied from 0 degrees to 90 degrees, e.g., set along the y-axis, to perform a second taper etching, i.e., to form a second undercut region 92. Since the taper etching is performed on the upper pattern 45 two times under the condition that the first angle (θ) is 0 degree and 90 degrees, the second undercut region 92 may be formed on sidewalls of the upper pattern 45 adjacent, e.g., substantially perpendicular, to the first undercut region 91 to form inclined sidewall 45b.

The second angle (Φ) may remain fixed during the first and second taper etching process, i.e., both when the first angle (θ) is 0 degree and 90 degrees, gradients of the sidewall of the first and second undercut regions 91 and 92 may be substantially equal to each other, and the value of the gradients may substantially equal to the second angle (Φ).

When a difference between the first angles in the two taper etchings is equal to the angle between the parallel portion 51 and the perpendicular portion 52, as illustrated in FIG. 11, a portion 99 between the portions 51 and 52 may remain unetched by the two taper etchings described above. In other words, the portion 99 of the upper layer 40 may remain at an inward cross point of the portion 51 and the portion 52.

Figure 12:
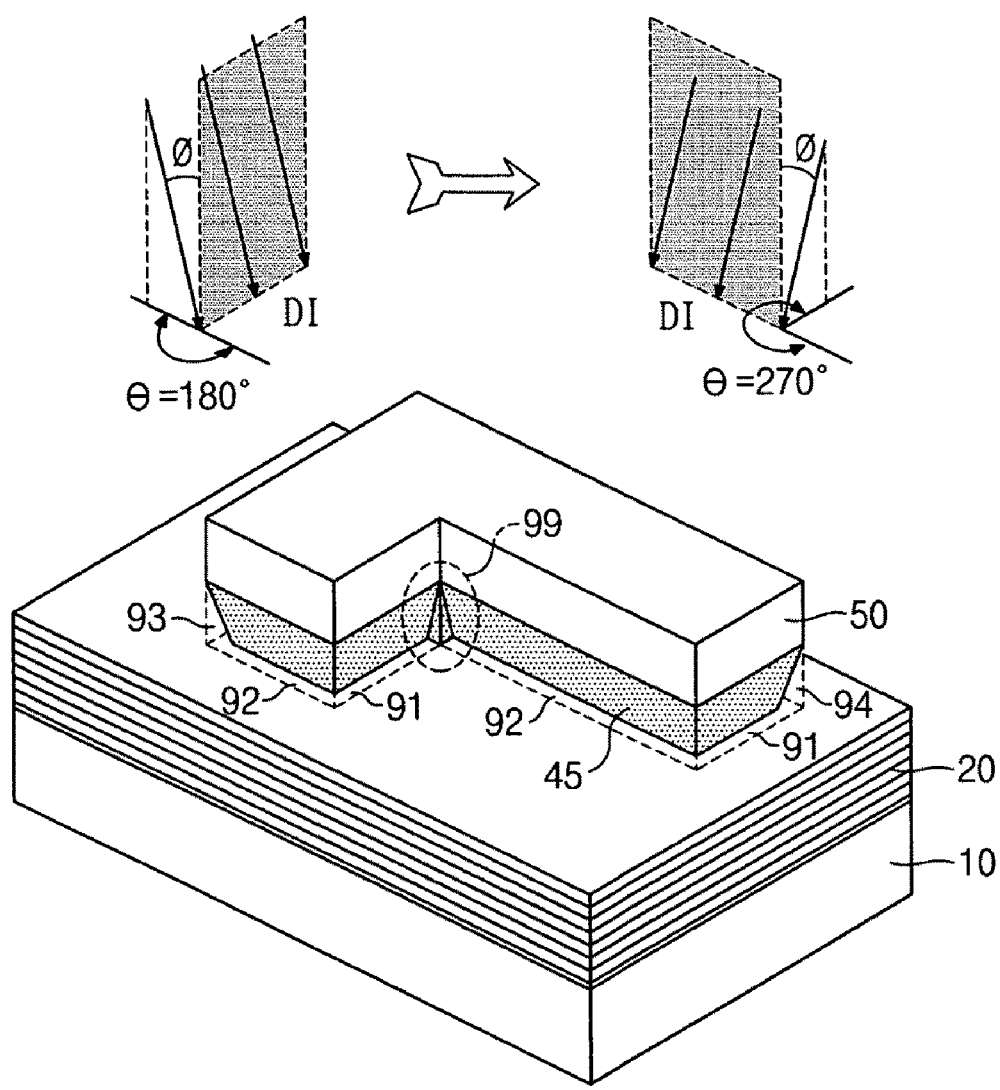

Referring to FIG. 12, additional taper etchings may be performed as described above. In particular, the first angle (θ) may be set as 180 degrees and 270 degrees, while the second angle (Φ) may remain fixed at the predetermined angle other than 0 degrees. In this case, as depicted in FIG. 12, a third undercut region 93 having an inclined sidewall may be formed on a third sidewall of the upper pattern 45 adjacent to the second undercut region 92, and a fourth undercut region 94 having an inclined sidewall may be formed on a fourth sidewall of the upper pattern 45 adjacent to the third undercut region 93. Accordingly, the multiple taper etchings may provide etching on all sides of a pattern.

Figure 13:
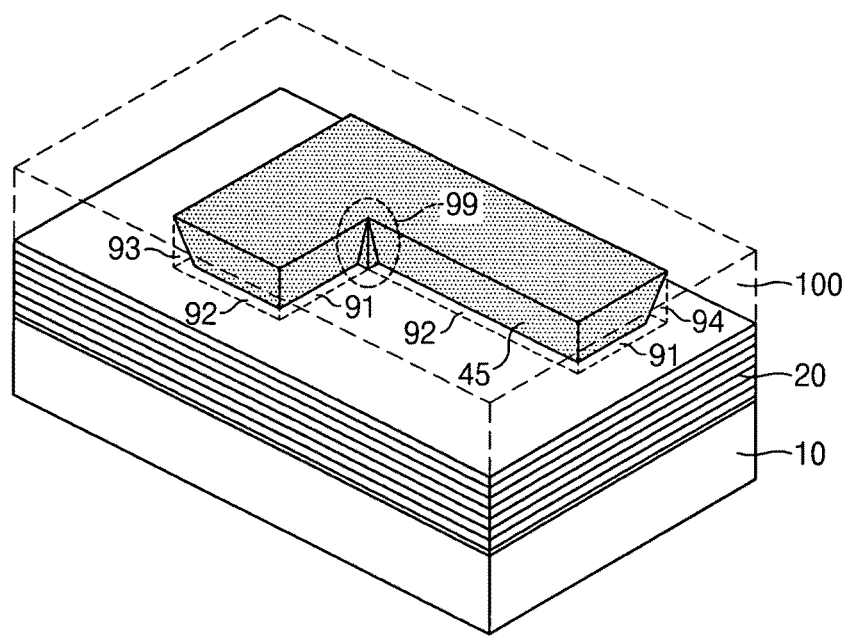

Referring to FIG. 13, the mask pattern 50 may be removed to expose a top surface of the upper pattern 45. In this case, as illustrated in FIG. 13, the upper pattern 45 may have an inverted trapezoidal shape or an inverted truncated pyramid shape. In other words, the upper pattern 45 may have an inverted trapezoid cross-section in each of the xz and yz planes.

Once the upper pattern 45 is complete, e.g., as illustrated in FIG. 13, an absorbing pattern may be formed using the upper pattern 45 as a molder (operation S8 in FIG. 9). In detail, operation S8 may include forming an absorbing layer (not shown) on a resultant structure on which the upper pattern 45 is formed. For example, the absorbing layer may be formed on the multilayer 20 to cover the upper pattern 45 in FIG. 13 and exposed portions of a top surface of the multilayer 20. Next, the absorbing layer may be etched, e.g., by etch-back process or a chemical mechanical polishing process, to expose a top surface of the upper pattern 45 and to form the absorbing pattern. For example, the absorbing pattern may be formed around the upper pattern 45. In another example, the upper pattern may surround the absorbing pattern. After that, the upper pattern 45 may be removed (operation S9 in FIG. 9), so the absorbing pattern may remain on the multilayer 20. For example, when an upper pattern surrounds an absorbing pattern 100, the absorbing pattern 100 may have a rectangular structure, as illustrated in FIG. 14.

The absorbing layer may include any suitable material absorbing an extreme ultraviolet. According to an embodiment, the absorbing layer may be formed of a conductive absorber, e.g., a tantalum nitride layer (TaN), but material for forming the absorbing layer is not limited to TaN and may be variously changed.

Operation S9 of removing the upper pattern 45 may be performed using an etching recipe having an etching selectivity with respect to the absorbing pattern 100. The recipe may be selected to selectively remove the upper pattern 45 while minimizing an etching of the absorbing pattern 100, and the upper pattern 45 may be selected among the materials which can realize the etching selectivity.

Figure 14:
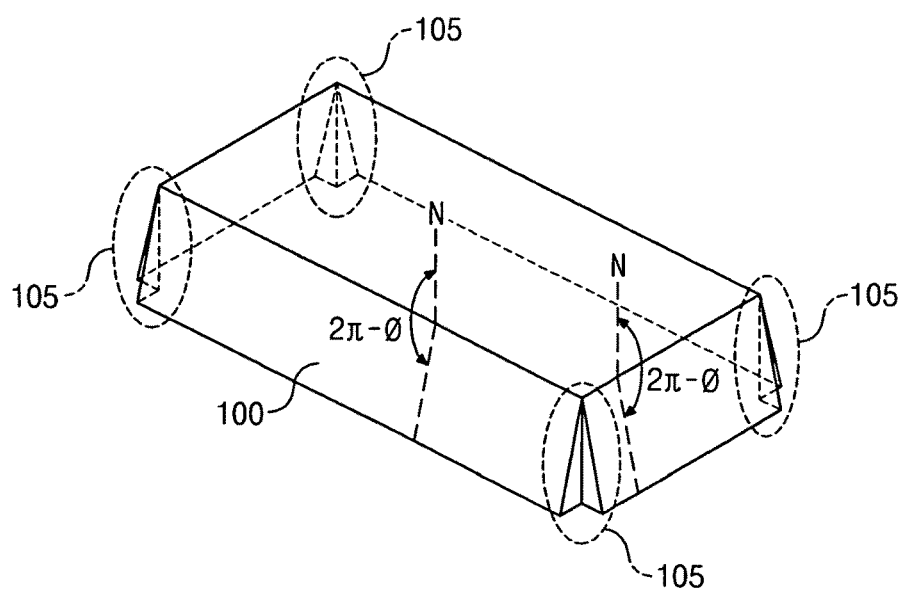

According to the second embodiment, since the upper pattern 45 has a cross section of an inverted truncated pyramid shape as described above, the absorbing pattern 100 formed using the upper pattern 45 as a molder may have a cross section of a truncated pyramid shape as depicted in FIG. 14. That is, sidewalls of the absorbing pattern 100 may be inclined at an angle of $[2\pi - \Phi]$ toward a normal (N) of a top surface of substrate 10 ($\Phi$ being the second angle expressing an extent that a top surface of the chuck 250 of the plasma etching chamber 200 rotates along an axis parallel to the top surface of chuck 250).

In addition, according to the second embodiment, at least one of corners of the absorbing pattern 100 may have a depression portion 105 of a right triangular pyramid shape. The depression portion 105 may be defined by sidewalls of the absorbing pattern 100, i.e., the sidewalls of the absorbing pattern 100 may be substantially perpendicular to each other. Also, the depression portion 105 may be a resultant structure corresponding to the remaining portion 99 in the upper pattern 45. As illustrated in FIG. 14, when the absorbing pattern 100 has a bar shape, the depression portion 105 may be formed at four corners of absorbing pattern 100.

If the remaining portion 99 is over-etched during the taper etching, a size of the depression portion 105 may be reduced. For example, a top portion of the depression portion 105 may be formed on a region lower than a top surface of the absorbing pattern 100. According to an embodiment, a size and a shape of the depression portion 105 may be controlled as a means to improve an optical proximity effect (OPE).

Manufacturing Method: A Third Embodiment

Figure 15:
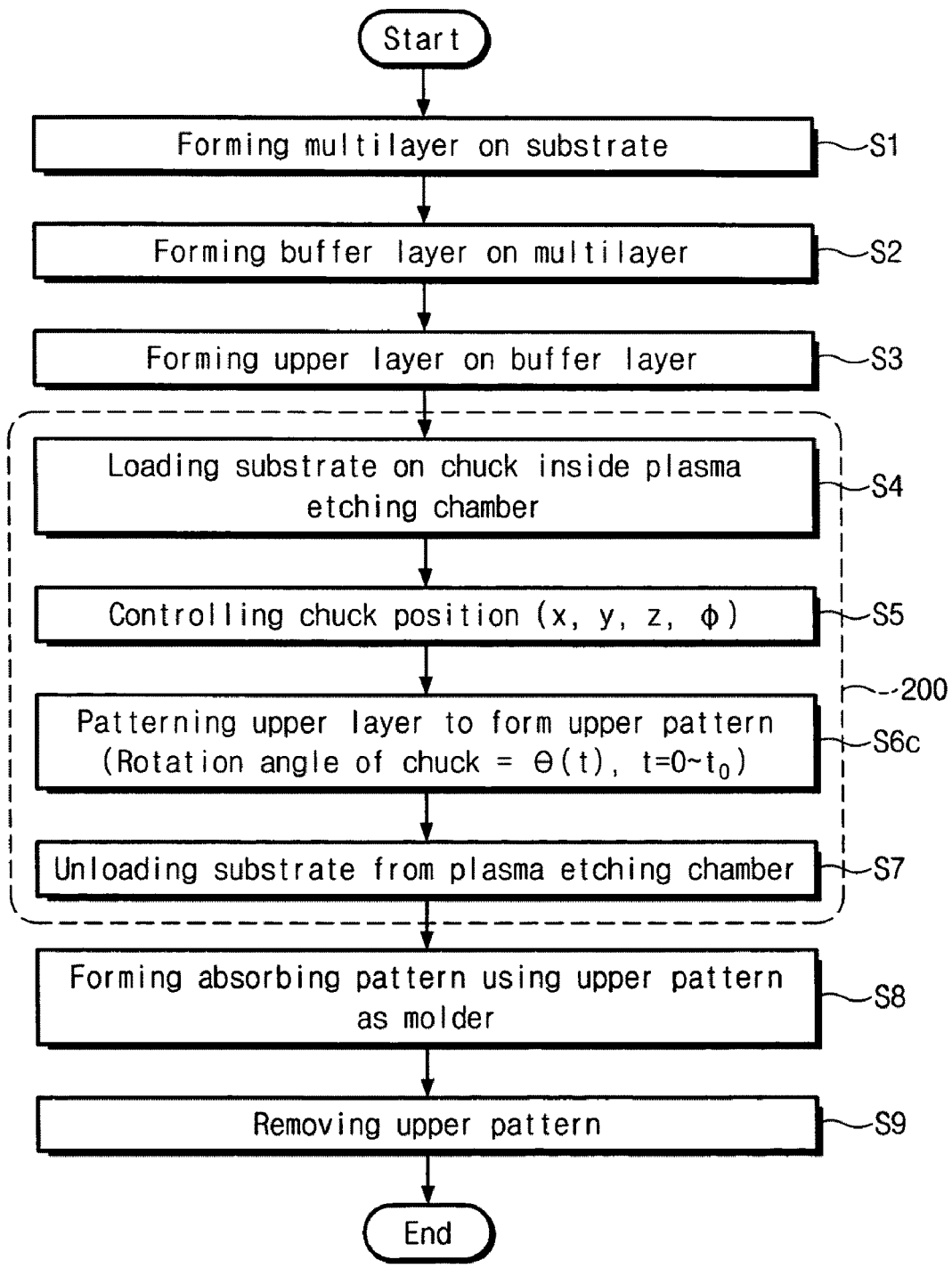
FIG. 15 illustrates a process flow chart of a method of manufacturing a photomask in accordance with a third embodiment.
Figure 16:
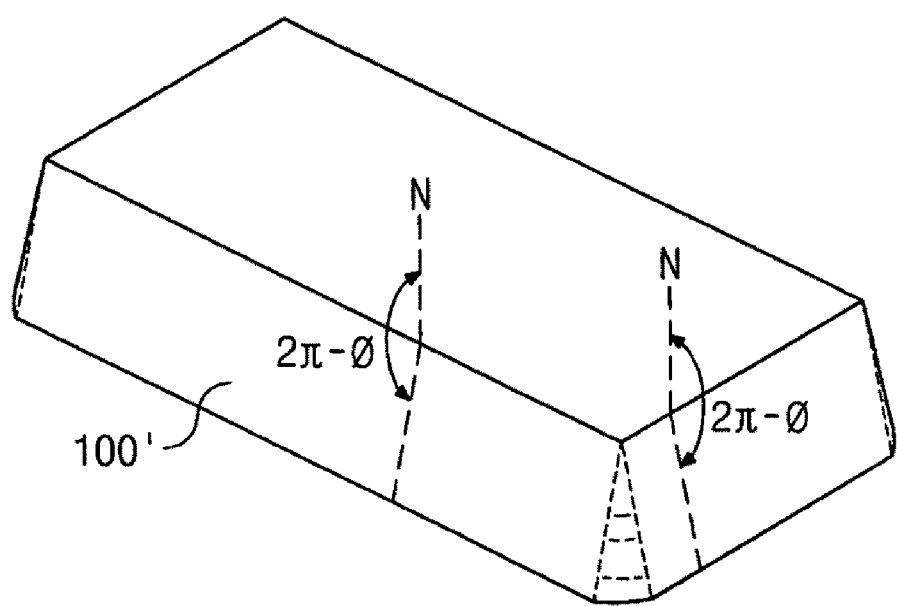
FIG. 16 illustrates a perspective view of a method of manufacturing a photomask in accordance with a third embodiment.

FIG. 15 illustrates a process flow chart of a method of manufacturing a photomask in accordance with a third embodiment. FIG. 16 illustrates a perspective view of a method of manufacturing a photomask in accordance with a third embodiment. The third embodiment may be substantially the same as the second embodiment described previously with reference to FIGS. 9-14, with the exception of a difference in a manufacturing method related to operation S6c of patterning the upper layer 40. Thus, overlapping descriptions will not be repeated.

Referring to FIGS. 15 and 16, operation S6c of patterning the upper layer 40 may be performed under the condition that position coordinates of the substrate 10 and the second angle ($\Phi$) are fixed and the first angle ($\theta$) continuously varies in the predetermined range. The range for the first angle ($\theta$) may be selected considering the required product characteristic. According to the third embodiment, the first angle ($\theta$) may continuously vary as a time function in the range of a predetermined angle range (e.g., 0 degree to 360 degrees). According to an embodiment, an angular velocity ($d\theta/dt$) of the first angle may be 0.001 (revolution/min) to 10 (revolution/min).

By the continuous revolution, a remaining portion 99 depicted in FIGS. 11 through 13 may not be formed at an inward cross point of the upper pattern 45 formed according to the third embodiment. That is, an inward corner of the upper pattern in accordance with the third embodiment may be formed to have a round shape. As a result, an absorbing pattern 100' formed using the upper pattern without the portion 99 as a molder in accordance with the third embodiment may have a corner of a round shape, as illustrated in FIG. 16.

Figure 20:
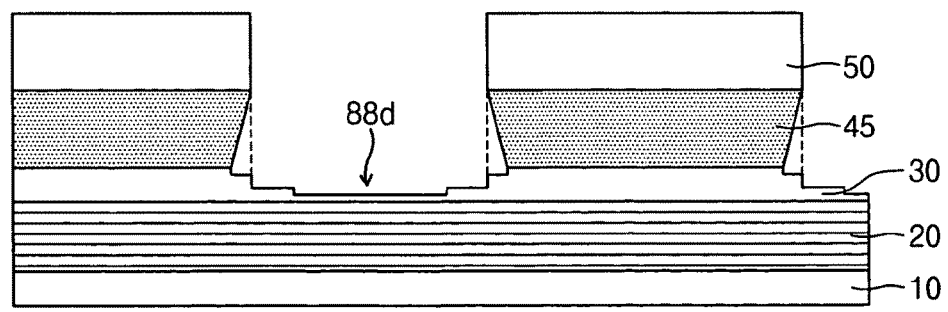
Figure 21:
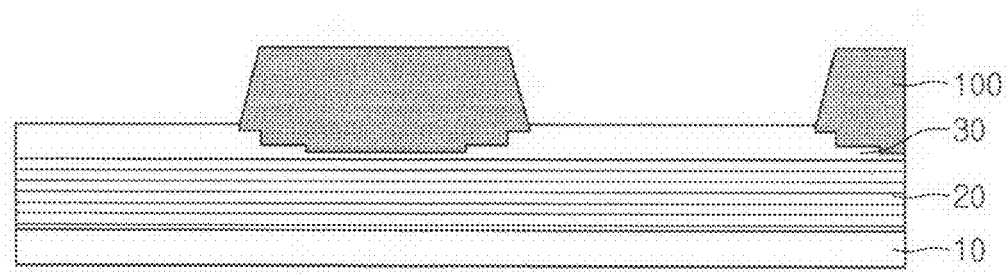
Figure 22:
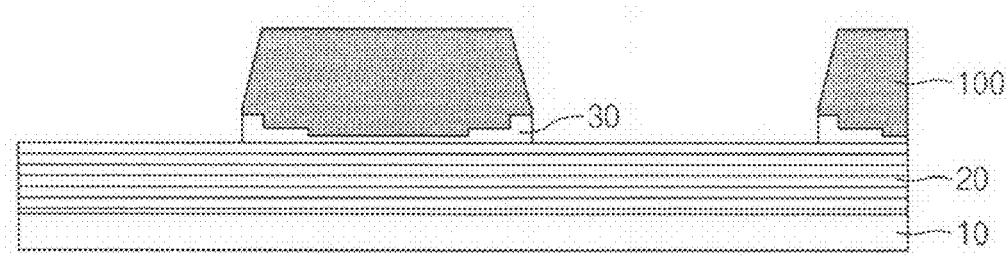
Figure 23:
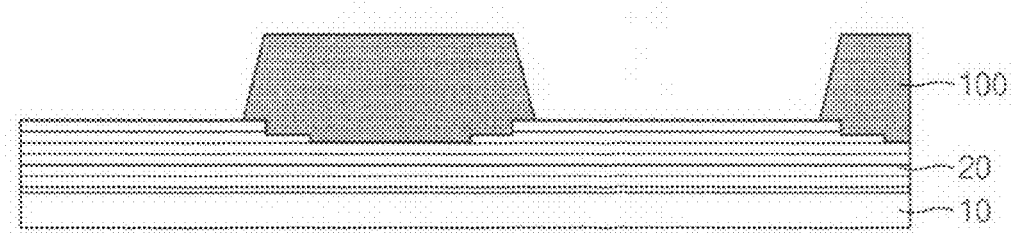

FIGS. 17 through 21 illustrate cross-sectional views in stages of manufacturing a photomask and its technical characteristics according to embodiments. FIGS. 22 and 23 illustrate modified embodiments. It is noted that the cross-sections in FIGS. 17-23 refer to an upper pattern having a plurality of parallel linear structures, e.g., a plurality of portions 52 parallel to each other, for convenience of illustration.

Figure 17:
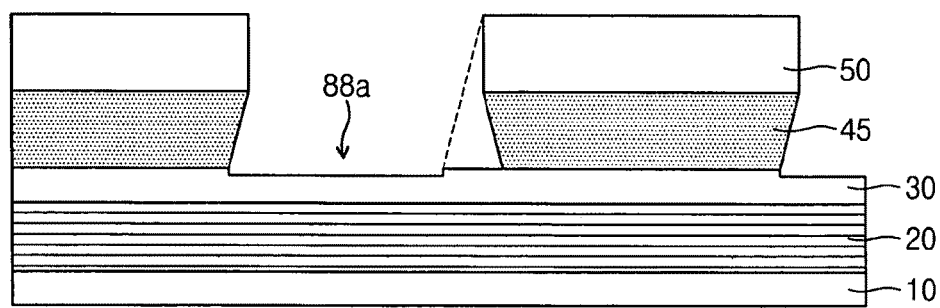
FIGS. 17 through 23 illustrate cross-sectional views of a technical characteristic of a photomask manufactured according to the manufacturing methods of embodiments.

Referring to FIG. 17, when the upper pattern 45 is formed by etching, a first recess region 88a may be formed in the buffer layer 30. For example, if the first taper etching is performed when the first angle ($\theta$) is set at 0 degrees, a portion of the buffer layer 30 may be removed when an incline of the right sidewall (in FIG. 17) of each of the illustrated portions of the upper pattern 45 is formed. The position of the first recess region 88a, i.e., width as measured from the left structure in FIG. 17, may be determined by the second angle, i.e., dashed line with respect to the right structure in FIG. 17. Therefore, the first recess region 88a may cause thickness non-uniformity in the buffer layer 30 under the upper pattern 45.

In the first embodiment, since the taper etching is performed under the condition that the substrate 10 is fixed, the first recess region 88A may be off-set from the upper pattern 45. In addition, according to the first embodiment described above, since the upper pattern 45 is used as an absorbing pattern, the first recess region 88a of a photomask in accordance with the first embodiment may be formed around the absorbing pattern (i.e., around the upper pattern 45).

Figure 18:
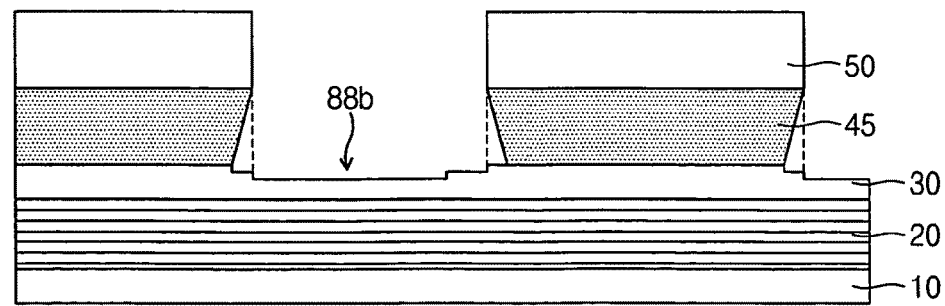
Figure 19:
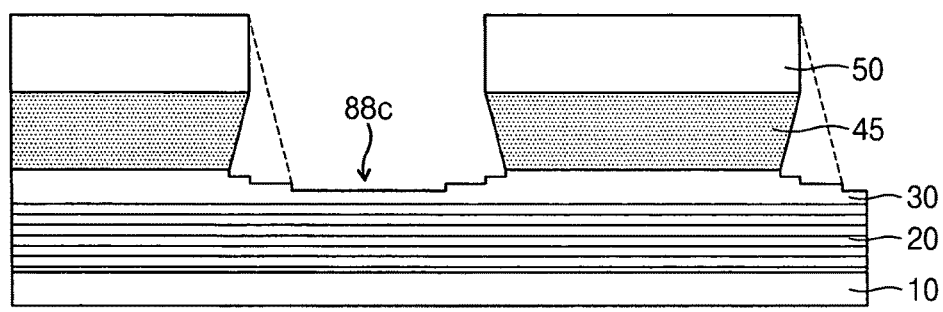

In the second embodiment, since the taper etching is performed under the condition that the substrate 10 rotates by 0 degree, 90 degrees, 180 degrees, and 270 degrees, multiple recess regions may be formed. That is, as illustrated in FIGS. 18-20, a second recess region (88b of FIG. 18), a third recess region (88c of FIG. 19), and a fourth recess region (88d of FIG. 20) may be formed when the first angle ($\theta$) is set at 90 degrees, 180 degrees, and 270 degrees, respectively. The first through fourth recess regions 88a through 88d may extend as steps and may be formed, e.g., sequentially, around the upper pattern 45 when the taper etching is performed.

According to the second embodiment, since the upper pattern 45 is used as a molder to form the absorbing pattern 100, the absorbing pattern 100 may be formed on the fourth recess region 88*d*. When the absorbing pattern 100 is formed, the upper pattern 45 and mask pattern 50 may be removed. As a result, as illustrated in FIG. 21, the buffer layer 30 under the absorbing pattern 100 may have a non-uniform thickness, i.e., a thickness which is greater at an edge of the absorbing pattern 100 than at a center of the absorbing pattern 100.

According to a modified embodiment, after removing the mask pattern 50 and the upper pattern 45, the buffer layer 30 around the absorbing pattern 100 may be etched to expose a top surface of multilayer 20. In this case, as illustrated in FIG. 22, a buffer pattern 35 having a thickness which is greater at an edge than at a center may be locally formed under the absorbing pattern 100.

According to another modified embodiment, the upper pattern 45 may be directly formed on the multilayer 20, i.e., without the buffer layer 30. In this case, recess regions may be formed in the multilayer 20, so a top surface of the multilayer 20 may be non-uniform, as illustrated in FIG. 23. Since the non-uniform region is formed in the multilayer 20 under the absorbing pattern 100, it may not substantially affect a quality of a photomask. That is, according to the second embodiment described above, forming a separate buffer layer 30 may be omitted.

In the third embodiment described above, since regions being etched become different according to a rotational angle, a recess region causing a non-uniform top surface similar to the second embodiment may be formed. However, a recess region in accordance with the third embodiment may not have a stair shape.

According to embodiments, an absorbing pattern of a photomask may be formed to have an inclined sidewall. Thus, the photomask in accordance with the embodiments may provide an improved technical effect in relation to a shadowing effect.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a photomask, comprising:
   forming a multilayer on a photomask substrate, such that the multilayer can be used as a Bragg reflector with respect to an extreme ultraviolet light;
   forming an upper layer on the photomask substrate, such that the multilayer is between the photomask substrate and the upper layer ; and
   patterning the upper layer to form an upper pattern having an inclined sidewall, wherein patterning the upper layer includes anisotropically etching the upper layer using charged particles moving in parallel to a first direction inclined toward a top surface of the upper layer.

2. The method as claimed in claim 1, wherein anisotropically etching the upper layer includes maintaining the photomask substrate fixed during the etching.

3. The method as claimed in claim 2, wherein anisotropically etching the upper layer includes forming the upper pattern to have a cross section of a parallelogram.

4. The method as claimed in claim 1, wherein anisotropically etching the upper layer includes rotating the photomask substrate around a rotating axis parallel to a normal to a top surface of the photomask during the etching.

5. The method as claimed in claim 4, wherein rotating the photomask substrate includes setting the photomask substrate at discrete angles around the rotating axis during the etching.

6. The method as claimed in claim 4, wherein rotating the photomask substrate includes continuously rotating the photomask substrate around the rotating axis during the etching.

7. The method as claimed in claim 4, wherein anisotropically etching the upper layer includes forming the upper pattern to have a cross section of an inverted trapezoid.

8. The method as claimed in claim 1, wherein the upper layer is formed of a material configured to absorb an extreme ultraviolet light.

9. The method as claimed in claim 1, further comprising forming a buffer layer between the upper layer and the multilayer, the buffer layer including at least one material having an etching selectivity with respect to the upper layer.

10. The method as claimed in claim 1, further comprising, after forming the upper pattern:
    forming an absorbing pattern on the photomask substrate using the upper pattern as a molder; and
    removing the upper pattern to expose a sidewall of the absorbing pattern.

11. The method as claimed in claim 10, wherein forming the absorbing pattern includes:
    forming an absorbing layer on the photomask substrate to surround the upper pattern, such that a space around the upper pattern is filled; and
    etching back the absorbing layer to expose a top surface of the upper pattern.

12. The method as claimed in claim 1, wherein anisotropically etching the upper layer includes arranging the photomask substrate with the upper layer thereon in a plasma etching chamber, such that the plasma etching chamber generates the charged particles to be directed at an oblique angle with respect to a top surface of the upper layer.

13. The method as claimed in claim 12, wherein anisotropically etching the upper layer further comprises:
    controlling a moving direction of the charged particles in the plasma etching chamber via a Faraday cage; and
    controlling an angle between the photomask substrate and the first direction via a position controller.

14. The method as claimed in claim 13, wherein anisotropically etching the upper layer further comprises controlling a rotation of the photomask on a rotating axis thereof via a rotation controller in the position controller.

15. The method as claimed in claim 1, wherein patterning the upper layer to form the upper pattern includes forming a plurality of separate upper patterns spaced apart from each other on the multilayer, such that a top surface of the multilayer facing the upper patterns is substantially flat and defines an acute angle with one sidewall of each of the upper patterns.

16. The method as claimed in claim 15, wherein patterning the upper layer to form the upper pattern includes exposing only substantially flat surfaces of the multilayer, such that extreme ultraviolet light incident directly on the multilayer is reflected from the multilayer.

17. The method as claimed in claim 1, wherein the multilayer and the upper layer are formed of different materials, such that extreme ultraviolet light is reflected from the multilayer and absorbed into the upper layer.

* * * * *